United States Patent
Kondo et al.

(10) Patent No.: US 6,786,969 B2
(45) Date of Patent: Sep. 7, 2004

(54) METHOD AND APPARATUS FOR PRODUCING SINGLE CRYSTAL, SUBSTRATE FOR GROWING SINGLE CRYSTAL AND METHOD FOR HEATING SINGLE CRYSTAL

(75) Inventors: Hiroyuki Kondo, Kariya (JP); Emi Oguri, Nishikamo-gun (JP); Fusao Hirose, Tsukuba (JP); Daisuke Nakamura, Aichi-gun (JP); Atsuto Okamoto, Aichi-gun (JP); Naohiro Sugiyama, Aichi-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/024,471

(22) Filed: Dec. 21, 2001

(65) Prior Publication Data
US 2002/0083892 A1 Jul. 4, 2002

(30) Foreign Application Priority Data
Dec. 28, 2000 (JP) ........................................ 2000-401550

(51) Int. Cl.[7] ............................. C30B 35/00; C23C 16/00
(52) U.S. Cl. ......................... 117/200; 118/726; 118/728
(58) Field of Search ..................... 117/200, 900; 118/715, 720, 724, 726, 728

(56) References Cited
U.S. PATENT DOCUMENTS

| | | | | |
|---|---|---|---|---|
| RE34,861 E | * | 2/1995 | Davis et al. ................. | 437/100 |
| 5,679,153 A | * | 10/1997 | Dmitriev et al. ............ | 117/106 |
| 5,683,507 A | * | 11/1997 | Barrett et al. ............... | 117/200 |
| 5,707,446 A | * | 1/1998 | Volkl et al. ................. | 117/200 |
| 5,788,768 A | * | 8/1998 | Barrett et al. ............... | 117/200 |
| 5,944,890 A | | 8/1999 | Kitou et al. | |
| 5,968,261 A | * | 10/1999 | Barrett et al. ................. | 117/13 |
| 5,985,026 A | | 11/1999 | Völkl et al. | |
| 6,048,398 A | * | 4/2000 | Vehanen et al. ............ | 117/200 |
| 6,056,820 A | * | 5/2000 | Balakrishna et al. ........ | 117/200 |
| 6,193,797 B1 | * | 2/2001 | Shiomi et al. ................. | 117/88 |
| 6,391,109 B2 | * | 5/2002 | Shiomi et al. .............. | 117/200 |
| 6,406,539 B1 | * | 6/2002 | Shigeto et al. ................ | 117/88 |
| 6,451,112 B1 | * | 9/2002 | Hara et al. ................... | 117/101 |
| 6,508,880 B2 | * | 1/2003 | Vodakov et al. ............ | 117/202 |
| 6,547,877 B2 | * | 4/2003 | Vodakov et al. ............ | 117/105 |
| 6,562,130 B2 | * | 5/2003 | Vodakov et al. ............ | 117/109 |
| 2002/0038627 A1 | * | 4/2002 | Vodakov et al. ............ | 117/201 |
| 2002/0096108 A1 | * | 7/2002 | Kuhn et al. ................. | 117/200 |

FOREIGN PATENT DOCUMENTS

| | | | |
|---|---|---|---|
| EP | 0554047 A1 * | 8/1993 | ........... C30B/29/36 |
| JP | A-9-110584 | 4/1997 | |
| JP | A-11-171691 | 6/1999 | |

* cited by examiner

Primary Examiner—Nadine G. Norton
Assistant Examiner—Matthew Anderson
(74) Attorney, Agent, or Firm—Posz & Bethards, PLC

(57) ABSTRACT

It is the purpose of the present invention to prevent a macroscopic defect in the production of an SiC single crystal. SiC source material powder and an SiC seed crystal are disposed inside a graphite crucible, and the SiC source material powder is thermally sublimated and recrystallized on a front surface of the SiC seed crystal to grow an SiC single crystal. In this sublimation-recrystallization method, a protection layer is provided on a back surface of the SiC seed crystal. The SiC seed crystal is mechanically supported by a supporting part disposed on the graphite crucible without bonding. Thereby, it is possible to improve the thermal maldistribution on the back surface of the SiC seed crystal and possible to suppress damage of the protection layer due to the thermal maldistribution. Thus, macroscopic defects in the grown SiC single crystal are preferably suppressed.

9 Claims, 9 Drawing Sheets

METHOD AND APPARATUS FOR PRODUCING SINGLE CRYSTAL, SUBSTRATE FOR GROWING SINGLE CRYSTAL AND METHOD FOR HEATING SINGLE CRYSTAL

CROSS REFERENCE TO RELATED APPLICATION

This application is based on and incorporates herein by reference Japanese Patent Application No. 2000-401550 filed on Dec. 28, 2000.

BACKGROUND OF THE INVENTION

The present invention relates to a method for producing silicon carbide (SiC) single crystal that is utilized for materials constituting a semiconductor device, a light-emitting diode or the like and to a producing apparatus therefor. Additionally, the invention relates to a SiC growth substrate for growing an SiC single crystal and to a method for heating the SiC single crystal.

The sublimation-recrystallization method has been widely used as a method for growing the SiC single crystal. In the proposed sublimation-recrystallization method, a seed crystal is supportably fixed to a graphite base disposed inside a graphite crucible, an SiC source material provided in the bottom of the crucible is heated and sublimated, a sublimated gas thereof is fed to the seed crystal, and thereby the SiC single crystal is grown on the seed crystal.

In the production of the SiC single crystal using the proposed sublimation-recrystallization method, a large defect (macroscopic defect) is generated from the interface between the seed crystal and the base. When a void exists between the seed crystal and the base when the seed crystal is fixed to the base, mass transfer from the seed crystal to the void is generated by sublimation and recrystallization inside the void. Thereby, the macroscopic defect is generated. Although a long SiC single crystal is obtained, due to the existence of the macroscopic defect, not only is it difficult to provide a large number of usable SiC wafers, but a hollow-shaped defect penetrating the crystal, so-called a micropipe, might also be induced by the macroscopic defect as a trigger. Thus, it is extremely difficult to obtain a high-quality SiC single crystal across a larger area by the proposed sublimation-recrystallization method.

To solve the above problem, in Japanese Patent Application Laid-Open No. 268096/1997, a seed crystal used in the sublimation-recrystallization method has a back surface, which is a back side of a plane where a single crystal is grown, covered with a stable protection layer. On the other hand, in Japanese Patent Application Laid-Open No. 110584/1997, a carbide layer interposing between a seed crystal and a base is applied to provide a homogeneous temperature distribution across a plane of the seed crystal.

Figure 9A:
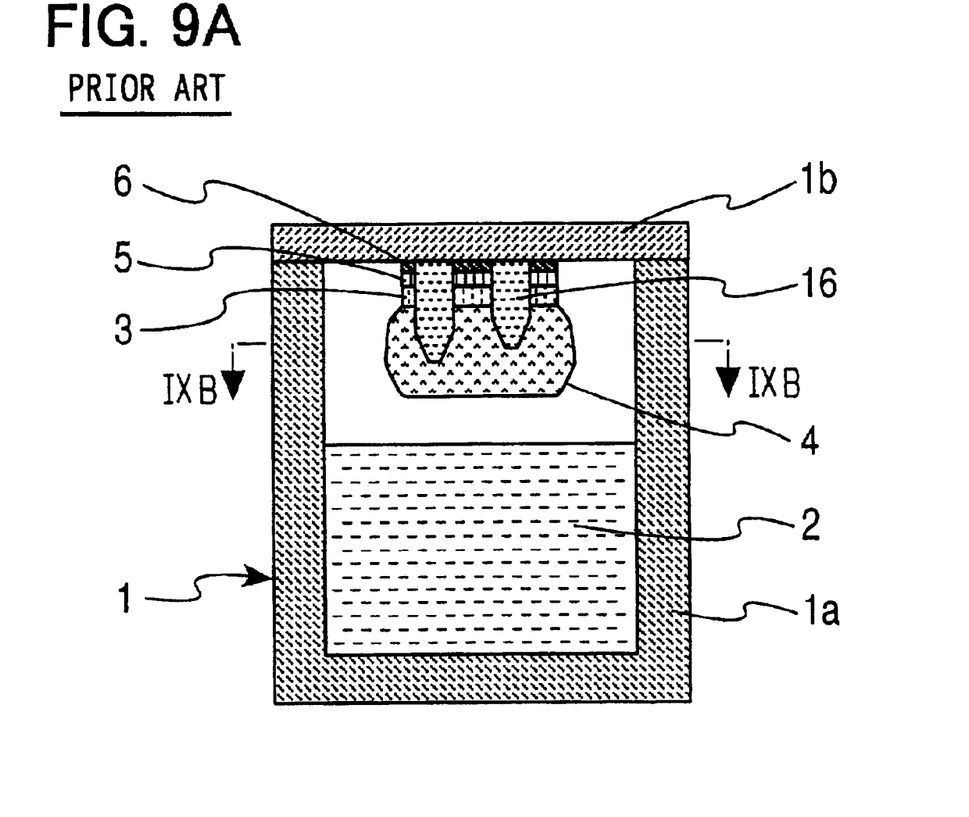
FIG. 9A is a vertical cross-sectional view showing a configuration of a proposed crystal growing apparatus and FIG. 9B is a horizontal cross-sectional view taken along a line a line IXB—IXB.
Figure 9B:
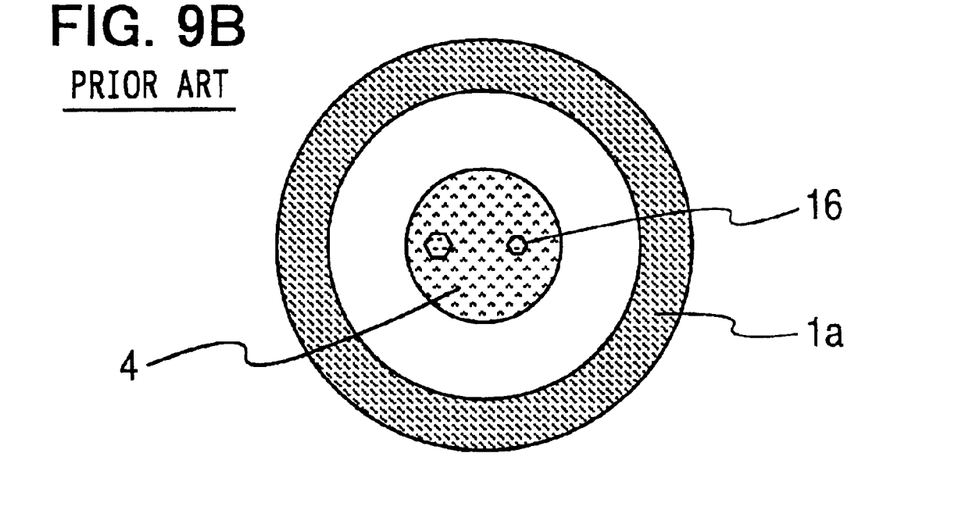

However, as shown in FIG. 9A, when a seed crystal 3 is disposed inside a crucible 1 filled with a silicon carbide source material powder 2 and the surface of a protection layer 5 is fixed to the center of the ceiling of the crucible 1, which is called a base hereinafter, with an adhesive 6, a local temperature distribution is generated in the fixed plane because of thickness heterogeneity of the adhesive 6 or uneven contact of the protection layer 5 to the base 1b. Consequently, the protection layer 5 is damaged, or the protective function is diminished. Thereby, macroscopic defects 16 reaching deeply the inside of a silicon carbide single crystal 4 are generated.

SUMMARY OF THE INVENTION

The present invention has been made in view of the above-mentioned aspects with an object to prevent the macroscopic defect and to enable to produce a high-quality, long SiC single crystal.

The inventors found that if the seed crystal is supported mechanically without using an adhesive while growing so as not to damage the protection layer on the back surface of the seed crystal, or alternatively, if the seed crystal is supported only by the periphery thereof with an adhesive, a macroscopic defect are prevented.

According to a first feature of the invention, a protection layer is provided on the back surface of a seed crystal and the seed crystal is mechanically supported. Thereby, a local stress concentration due to the heterogeneous temperature distribution caused by uneven attachment of the seed crystal with an adhesive is not generated in the protection layer. Thus, the protection layer is not damaged, and a macroscopic defect is prevented.

This single crystal growing method is accomplished with many variations. For example, the seed crystal having the protection layer on the back surface is suspended and supported at the periphery thereof while an SiC single crystal is grown. Alternatively, the seed crystal is suspended and supported by a plurality of hook-shaped members while an SiC single crystal is grown. It is further preferable to use a seed crystal in a hexagonal shape in which the direction defined by a vertex and a diagonal vertex is set to be <11$\bar{2}$0> and plane direction of the crystal is (0001), and to suspend and support the seed crystal by a plurality of hook-shaped members at the vicinity of vertices of the hexagon. For example, if the seed crystal is supported at three positions at the vicinity of the vertices, the generation of defects is prevented except at the three positions having the fastest crystal growth rate in expanding direction, and circular SiC wafers are efficiently cut out of a grown crystal.

Furthermore, it is preferable to support the SiC seed crystal with a predetermined gap between the protection layer provided on the back surface of the SiC seed crystal and a wall of a container facing thereto. By providing the predetermined gap, a local stress concentration due to the heterogeneous temperature distribution is not generated in the protection layer. Thus, the protection layer is not damaged and the macroscopic defect is prevented.

Preferably, a lid-shaped member facing to the protection layer on the SiC seed crystal is disposed for suppressing temperature distribution. A material making up the lid-shaped member has a thermal conductivity different from that of a seed crystal supporting member having a seed crystal supporting part. Thereby, the temperature distribution of the seed crystal is suppressed. By using a lid-shaped member having a thermal conductivity greater than that of the seed crystal supporting member, the temperature distribution of the crystal is readily suppressed. Thereby, a high-quality SiC single crystal with fewer macroscopic defects is obtained.

Besides, the SiC seed crystal may be supported in such a manner that the seed crystal closes an opening disposed in the wall of the container and the back surface thereof, where the protection layer is provided, is exposed to the outside space.

Applicable materials for the protection layer on the back surface of the SiC seed crystal are, specifically, a carbon layer, metal carbide layer with high melting point, silicon carbide epitaxial layer, silicon carbide polycrystalline layer, silicon carbide amorphous layer or multilayer film constituted of above layers. When a carbon layer, metal carbide layer with high melting point such as TaC, WC, MoC or TiC, silicon carbide epitaxial layer, or high density polycrystalline layer is formed on the back surface of the SiC seed crystal, the back surface of the SiC seed crystal is preferably protected. Thus, the protection layer escapes being damaged while growing and the generation of a macroscopic defect is suppressed.

Further preferably, a growth surface of the SiC seed crystal substrate, on which SiC crystal grows, is projected downwardly to the SiC source material side farther than a supported face, by which the SiC seed crystal substrate is supported. Thereby, the SiC single crystal grows without being unified with the supporting member.

These method and apparatus for producing a single crystal, substrate structure for growing a single crystal and method for heating a single crystal are also effective for other crystal growths, not limiting to SiC.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described in detail with reference to various embodiments.

(First Embodiment)

Figure 1A:
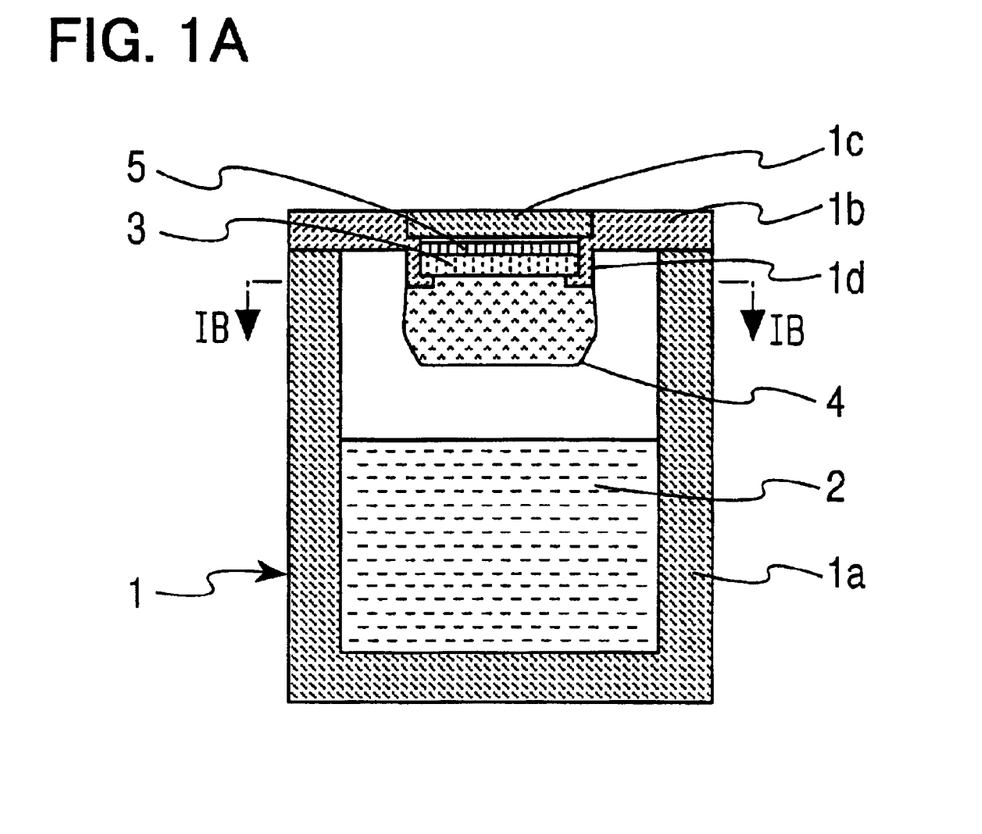
FIG. 1A is a vertical cross-sectional view showing a configuration of a crystal growing apparatus in a first embodiment of the present invention and FIG. 1B is a horizontal cross-sectional view taken along a line IB—IB.

As shown in FIG. 1A, a graphite crucible 1 is used as a container for the crystal growing apparatus. SiC source material powder 2 is provided at the bottom of the graphite crucible 1. The SiC powder 2 is thermally sublimated for growing an SiC single crystal 4 on an SiC seed crystal 3 that is an SiC single crystal substrate.

Figure 1B:
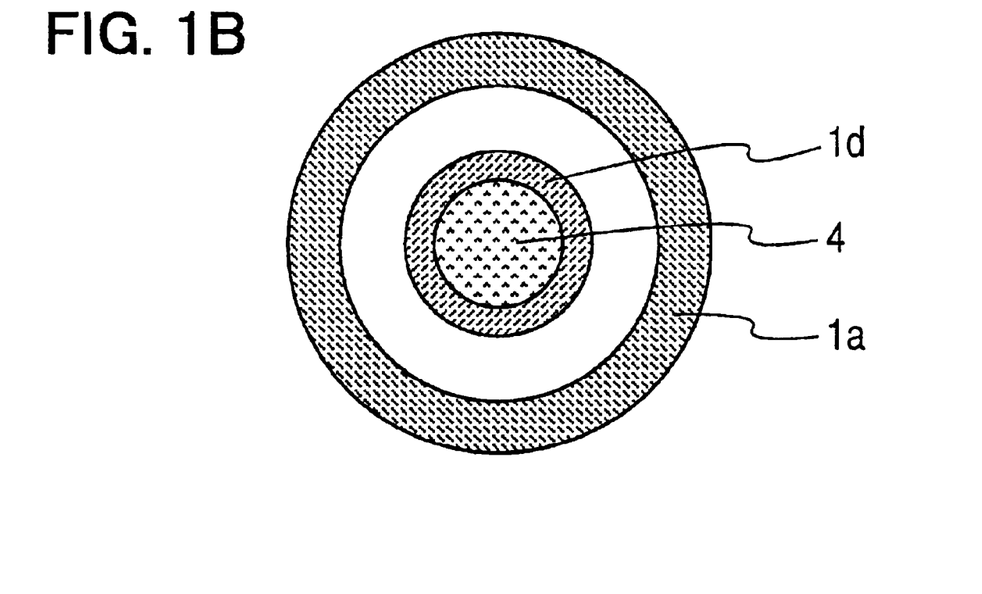

The graphite crucible 1 is constituted of a crucible main body 1a in a substantially cylindrical shape with a first opening, a seed crystal supporting member 1b with a second opening for the SiC seed crystal 3, and a lid-shaped member (hereafter, it is called a lid member) 1c for closing the second opening of the seed crystal supporting member 1b. The seed crystal supporting member 1b covers the first opening in the top face of the crucible main body 1a. The side wall defining the second opening has a supporting part 1d that extends cylindrically downward and is bent inward at the lower end thereof to provide a fringe part extending inward. The SiC seed crystal 3 is inserted and placed inside the second opening of the seed crystal supporting member 1b from the upper side and is supported by the ring-shaped fringe part of the supporting member 1d, as shown in FIG. 1B.

The supporting part 1d is designed in such a manner that the ring-shaped fringe part contacts the front surface of the SiC seed crystal 3 with the minimum area necessary for supporting and that the single crystal 4 is not prevented from expanding horizontally. Additionally, the inner diameter of the cylindrical supporting part 1d is set to be substantially the same as the outer diameter of the SiC seed crystal 3 to surround the circumference of the SiC seed crystal 3 without an unfavorable clearance. Thereby, an SiC source material gas is contained inside.

A protection layer 5, specifically a carbon layer, is formed beforehand on the back surface of the SiC seed crystal 3. As the carbon layer, for example, a resist carbonized layer, a sputtered layer, a vapor deposited layer, or the like are usable. As the protection layer 5, in addition to these, a high density layer such as a carbon layer, metal carbide layer with high melting point such as TaC, WC, MoC or TiC, silicon carbide epitaxial layer, polycrystalline layer and an amorphous layer are applicable. Alternatively, a multilayer film constituted of above layers may be used. With the protection layer 5 of this kind, the back surface of the SiC seed crystal 3 is protected while growing.

The opening of the seed crystal supporting member 1b is closed with the lid member 1c. The lid member 1c is disposed with a predetermined gap on the protection layer 5 and performs a gap adjusting function by adjusting the width of the gap. Whereby, the local temperature distribution is suppressed across the protection layer 5. In addition, by adjusting the width, the growth rate is controlled. Furthermore, the lid member 1c is made of a material having a thermal conductivity greater than that of the seed crystal supporting member 1b and thereby also performs a temperature distribution adjusting function for the SiC seed crystal 3. Because the lid member 1c has a greater thermal conductivity, it functions as a radiation plate to maintain the temperature of the SiC seed crystal 3 low and prevents the local temperature distribution. The gap between the SiC seed crystal 3 and the lid member 1c is set to be about 70 $\mu$m.

Although not illustrated, a heater heats the graphite crucible 1 inside a vacuum container, into which argon gas is introduced. By adjusting the power of the heater, the temperature of the SiC seed crystal 3 is maintained at about 100° C. lower than the temperature of the SiC source material powder 2.

The processes for producing the SiC single crystal using the crystal growing apparatus constructed in this manner will be described hereinafter.

First, the SiC source material powder 2 is heated at 2000 to 2500° C. Then, the heater is adjusted to provide a temperature gradient inside the graphite crucible 1 in such a manner that the temperature of the SiC seed crystal 3 is lower than that of the SiC source material powder 2. Subsequently, pressure inside the graphite crucible 1 is set to be 13.3 Pa to 26.7 kPa to start crystal growth by the sublimation method. The SiC source material powder 2 is sublimated to be a sublimated gas. The gas reaches the SiC seed crystal 3, and the SiC single crystal 4 is grown on the front surface of the SiC seed crystal 3 where the temperature is relatively lower than that of the SiC source material powder 2 side.

Because the seed crystal supporting member 1b supports the SiC seed crystal 3 with the minimum contact area, the SiC single crystal 4 is not unfavorably prevented from expanding in the diameter direction, the protection layer 5 on the back surface of the SiC seed crystal 3 is not damaged, and macroscopic defects are suppressed. Therefore, a high-quality, long SiC single crystal 4 is formed.

(Second Embodiment)

Figure 2A:
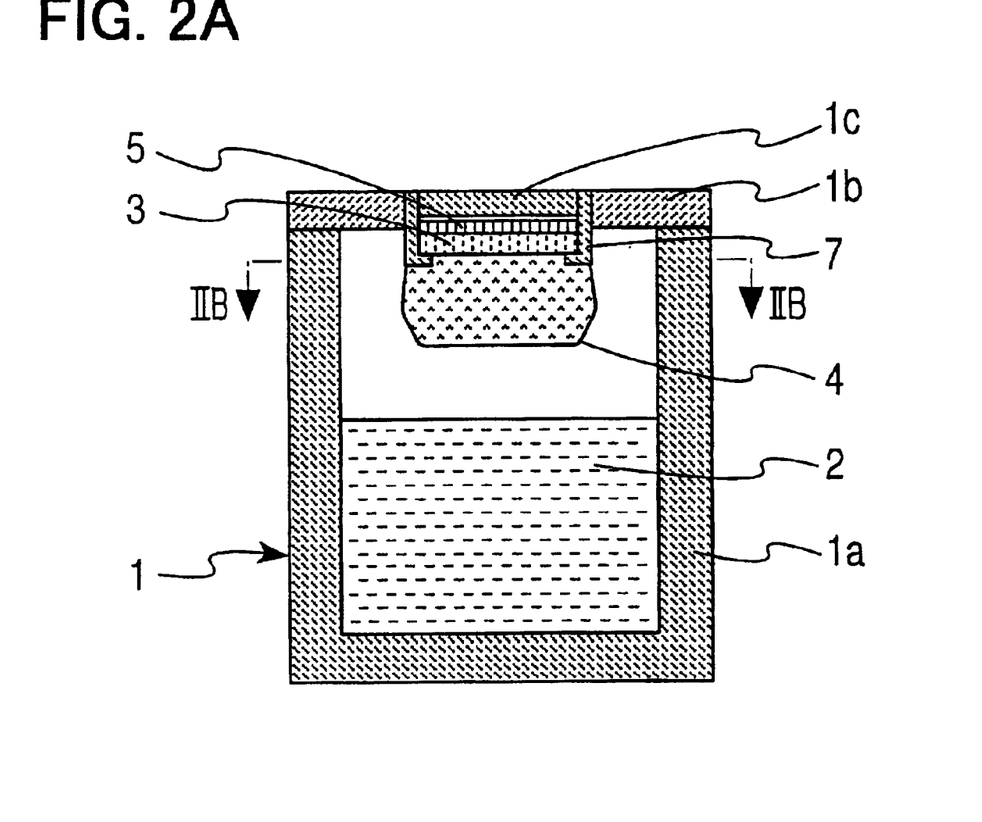
FIG. 2A is a vertical cross-sectional view showing a configuration of a crystal growing apparatus in a second embodiment of the present invention and FIG. 2B is a horizontal cross-sectional view taken along a line IIB—IIB.
Figure 2B:
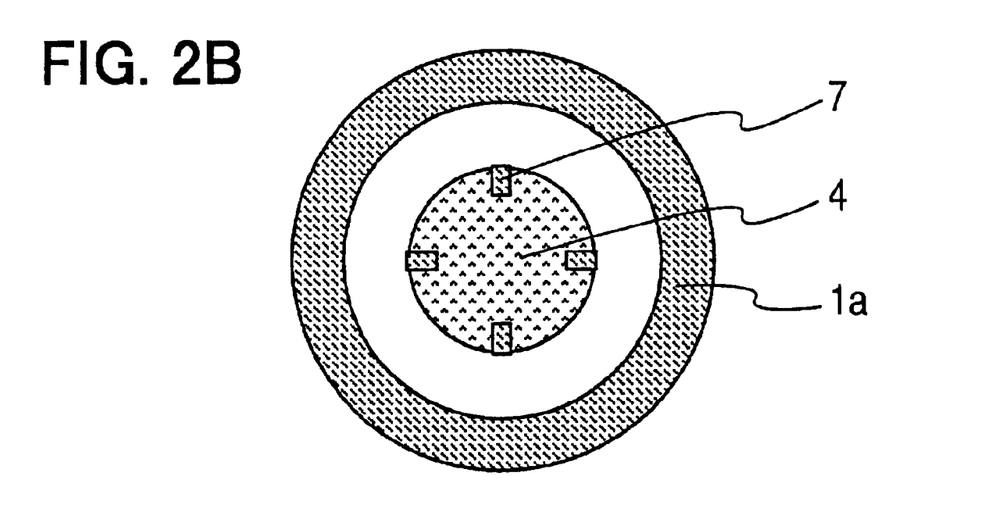

Hereafter, the production of the SiC single crystal in a second embodiment will be described with reference to FIGS. 2A and 2B. The apparatus configuration and the processes for producing the SiC single crystal are the same as in the first embodiment. Only different points will be described.

In this embodiment, hook-shaped members 7 support the SiC seed crystal 3 at only a few positions of the seed crystal 3. The hook-shaped members 7 are fixed to a plurality of points (four points in FIG. 2B) on the side wall defining the opening of the seed crystal supporting member 1b and support the SiC seed crystal 3. In this configuration as well, the SiC seed crystal 3 is supported inside the opening of the seed crystal supporting member 1b in such a manner that the sublimated gas of the SiC source material does not go to the back surface side of the SiC seed crystal 3.

In the second embodiment, the SiC seed crystal 3 is supported at only a few positions on the periphery of the front surface thereof with small contact areas with the hook-shaped members 7. Therefore, the SiC single crystal 4 is not unfavorably prevented from expanding in the diameter direction, the protection layer 5 on the back surface of the SiC seed crystal 3 is not damaged, and macroscopic defects are suppressed. Thus, a high-quality, long SiC single crystal 4 is formed.

(Third Embodiment)

Figure 3A:
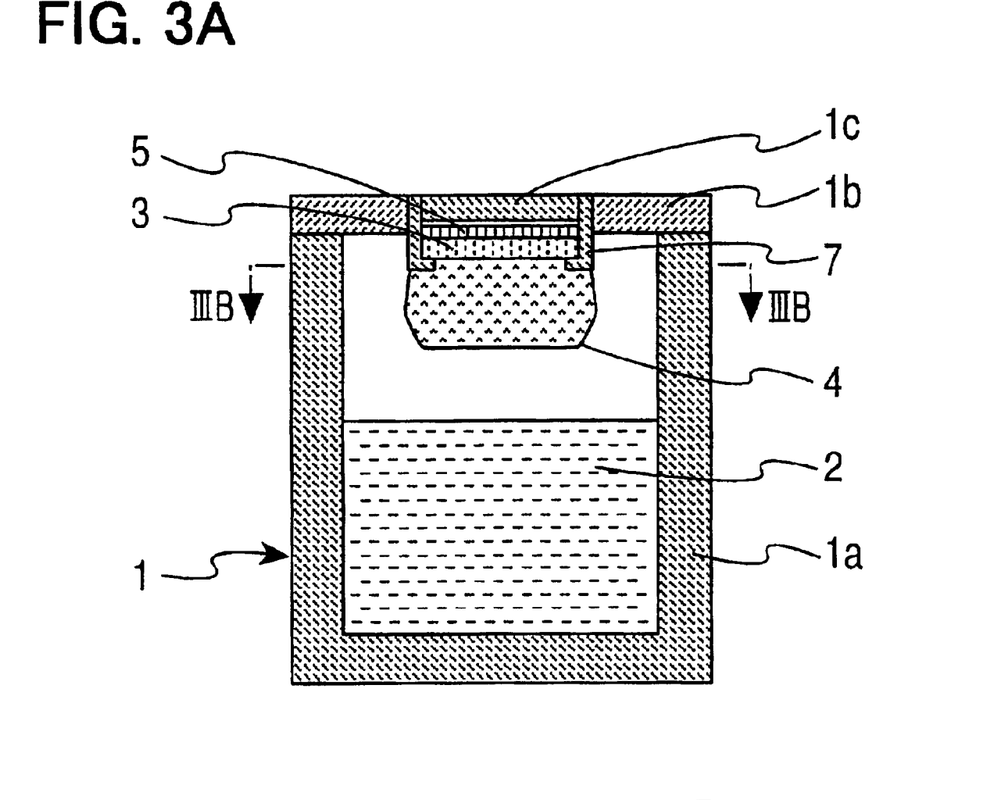
FIG. 3A is a vertical cross-sectional view showing a configuration of a crystal growing apparatus in a third embodiment of the present invention and FIG. 3B is a horizontal cross-sectional view taken along a line IIIB—IIIB.
Figure 3B:
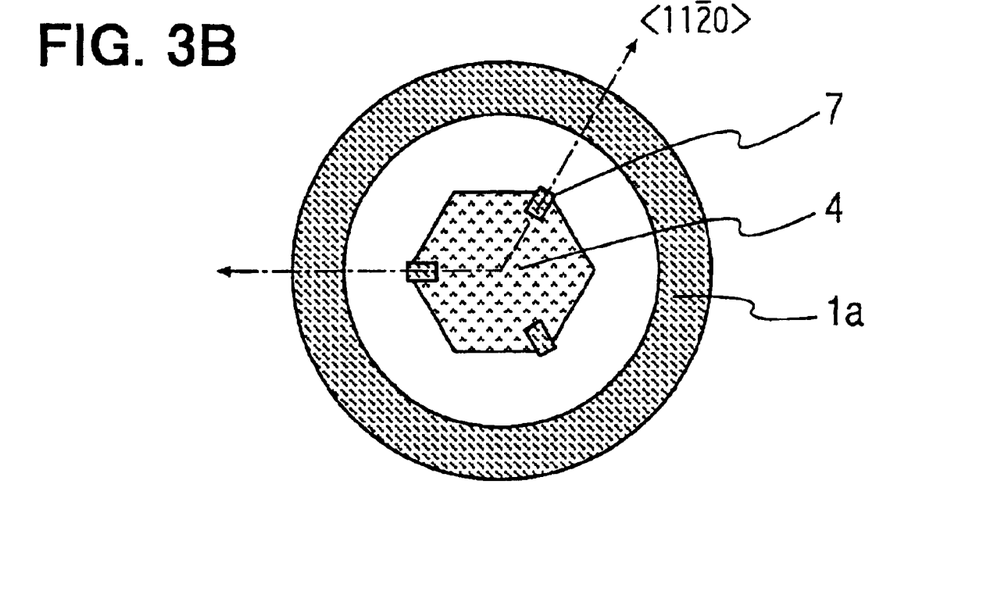

Hereafter, the production of the SiC single crystal in a third embodiment will be described with reference to FIGS. 3A and 3B. The apparatus configuration and the processes for producing the SiC single crystal are the same as in the first embodiment. Therefore, only different points will be described.

In the third embodiment, the seed crystal 3 having a hexagonal shape is used. The direction defined by a vertex and a diagonal vertex of the hexagon is <11$\bar{2}$0>. The plane direction of the crystal 3 is (0001). The seed crystal 3 is supported by three hook-shaped members 7 at the vicinity of vertices of the hexagon where crystal growth rate is the fastest in the expanding direction. Therefore, the SiC single crystal 4 is not unfavorably prevented from expanding in the diameter direction, the protection layer 5 on the back surface of the SiC seed crystal 3 is not damaged, and macroscopic defects are suppressed. Thus, a high-quality, long SiC single crystal 4 is formed. In addition, circular SiC wafers are efficiently cut out of the polygonal grown crystal, and an SiC single crystal having a large diameter is provided.

(Fourth Embodiment)

Figure 4A:
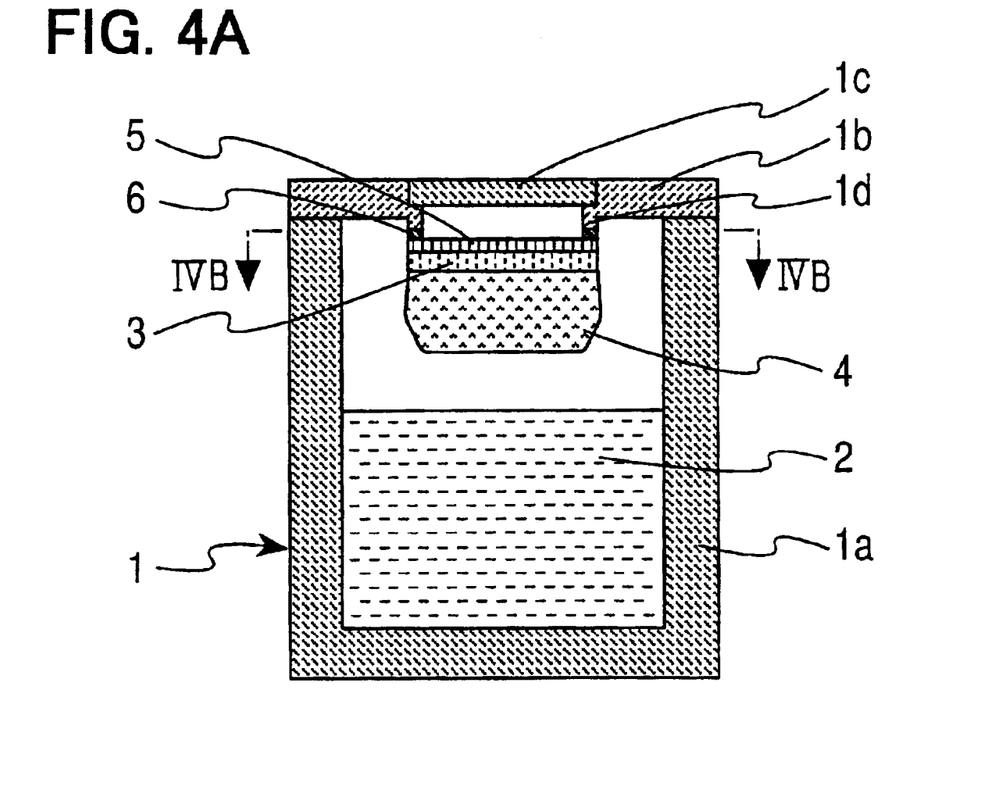
FIG. 4A is a vertical cross-sectional view showing a configuration of a crystal growing apparatus in a fourth embodiment of the present invention and FIG. 4B is a horizontal cross-sectional view taken along a line IVB—IVB.
Figure 4B:
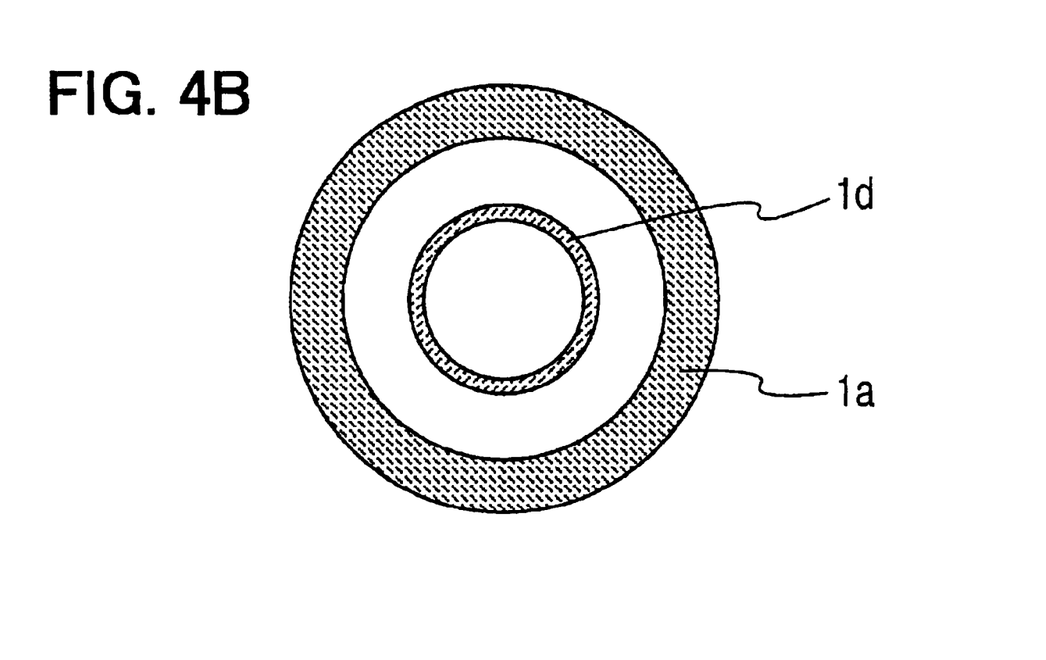

Hereafter, the production of the SiC single crystal in a fourth embodiment will be described with reference to FIGS. 4A and 4B. However, the apparatus configuration and the processes for producing the SiC single crystal are the same as in the first embodiment. Thus, only different points will be described.

In the fourth embodiment, the SiC seed crystal 3 is supported at only the periphery of the back surface thereof by bonding the periphery with an adhesive 6 to the cylindrical supporting part 1d extending downward from the side wall defining the opening of the seed crystal supporting member 1b. In this embodiment, the extending end of the supporting part 1d has no fringe. The back surface of the SiC seed crystal 3 is bonded to the extending end face. Thereby, the entire front surface is used to grow the SiC single crystal 4 and simultaneously is bonded to the adhesive 6 at the periphery thereof with a small contact area. Thus, the protection layer 5 on the back surface of the SiC seed crystal 3 is not damaged, macroscopic defects are suppressed, and the SiC single crystal 4 is not prevented from expanding in the diameter direction. Accordingly, a high-quality, long SiC single crystal 4 is formed.

(Fifth Embodiment)

Figure 5A:
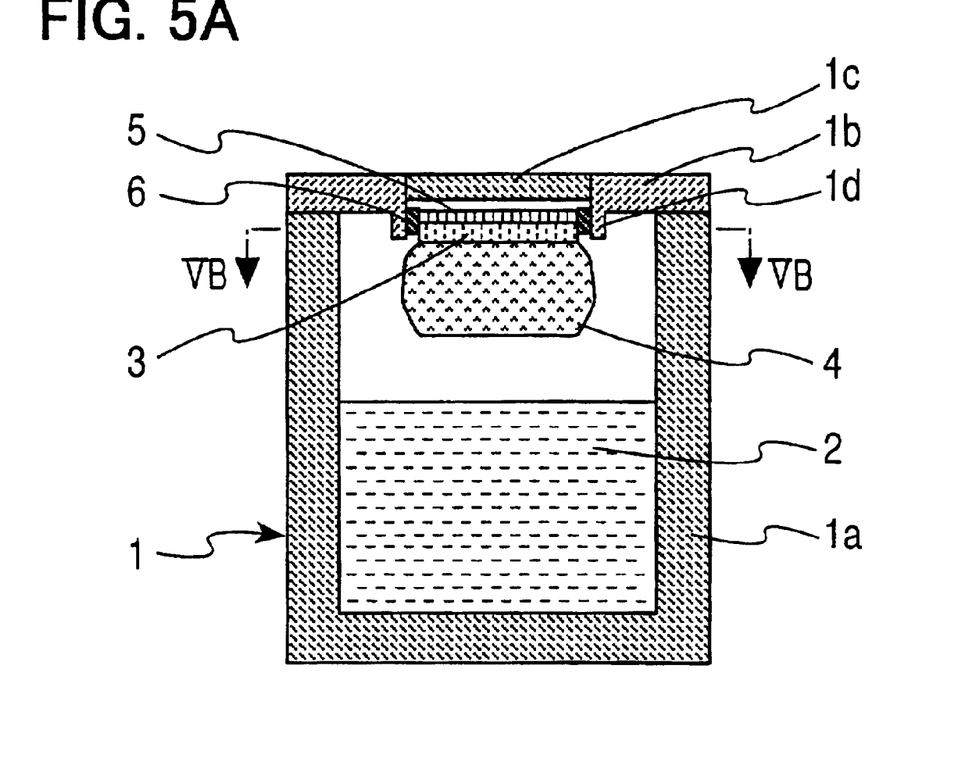
FIG. 5A is a vertical cross-sectional view showing a configuration of a crystal growing apparatus in a fifth embodiment of the present invention and FIG. 5B is a horizontal cross-sectional view taken along a line VB—VB.
Figure 5B:
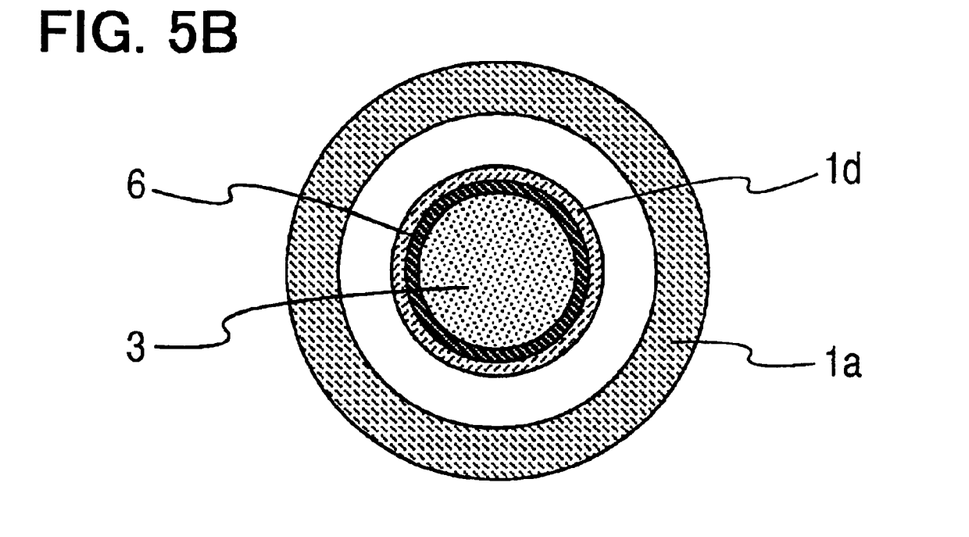

Hereafter, the production of the SiC single crystal in a fifth embodiment will be described with reference to FIGS. 5A and 5B. However, the apparatus configuration and the processes for producing the SiC single crystal are the same as in the third embodiment. Thus, only different points will be described.

In the fifth embodiment, the circumference of the SiC seed crystal 3 is supported by bonding the seed crystal 3 to the side wall defining the opening of the cylindrical supporting part 1d with the adhesive 6. Therefore, the protection layer 5 on the back surface of the SiC seed crystal 3 is not damaged, macroscopic defects are suppressed, and the SiC single crystal 4 is not prevented from expanding in the diameter direction. Accordingly, a high-quality, long SiC single crystal 4 is formed.

(Sixth Embodiment)

Figure 6A:
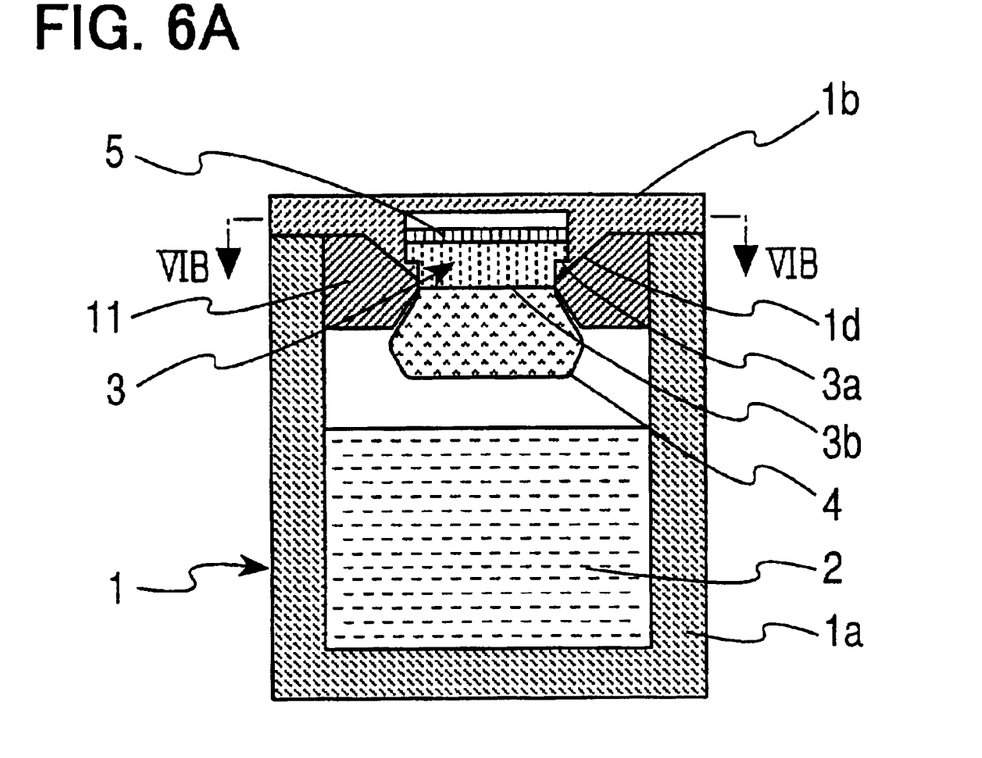
FIG. 6A is a vertical cross-sectional view showing a configuration of a crystal growing apparatus in a sixth embodiment of the present invention and FIG. 6B is a horizontal cross-sectional view taken along a line VIB—VIB.
Figure 6B:
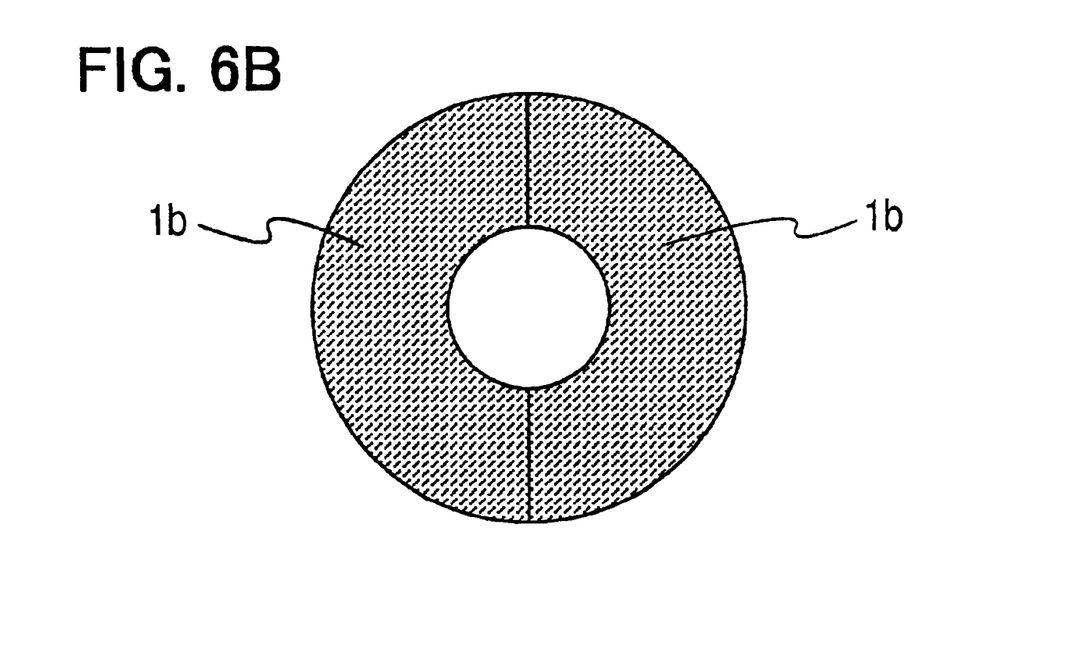

Hereafter, the production of the SiC single crystal in a sixth embodiment will be described with reference to FIGS. 6A and 6B. However, the apparatus configuration and the processes for producing the SiC single crystal are the same as in the first embodiment. Thus, only different points will be described.

In the sixth embodiment, the SiC seed crystal 3 made of an SiC single crystal substrate has a supported face 3a, by which the SiC seed crystal 3 is supported, and a growth surface 3b, on which an SiC crystal grows. The growth surface 3b projects downward to the SiC source material side farther than the supported face 3a. In addition, the supporting part 1d is formed in such a manner that the inner surface thereof, which constitutes a ceiling of the crucible 1, has an upside-down cone shape. Thereby, an SiC polycrystalline 11 deposited on the surface of the upside-down cone in the direction perpendicular thereto is prevented from hindering the growth of the growing SiC single crystal 4. The seed crystal supporting member 1b is formed to provide a two-way split structure, as shown in FIG. 6B. Two semicircular top faces fit each other, and make a ceiling above the SiC seed crystal 3. Thus, the lid member 1c is not provided.

As formed in this manner, the SiC seed crystal 3 is supported only by the supported face 3a. Thereby, the SiC single crystal 4 is not prevented from growing on the growth face 3b projecting toward the SiC source material 2 side. Therefore, the protection layer 5 on the back surface of the SiC seed crystal 3 is not damaged, macroscopic defects are suppressed, and the SiC single crystal 4 is not prevented from expanding in the diameter direction. Accordingly, a high-quality, long SiC single crystal 4 is formed.

(Seventh Embodiment)

Figure 7A:
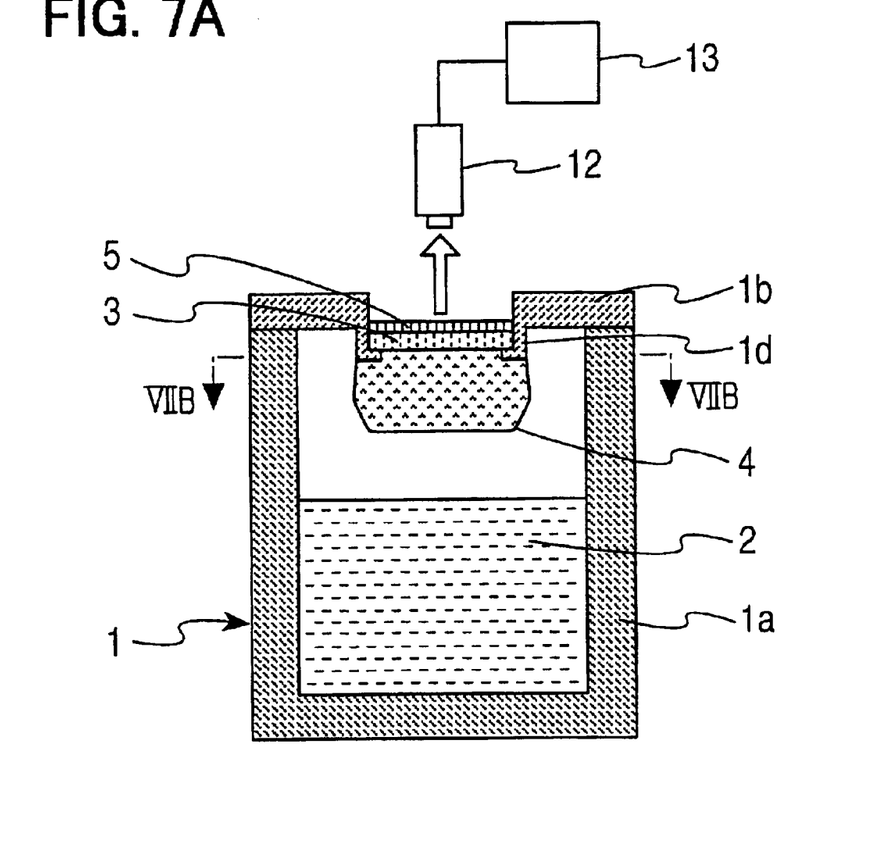
FIG. 7A is a vertical cross-sectional view showing a configuration of a crystal growing apparatus in a seventh embodiment of the present invention and FIG. 7B is a horizontal cross-sectional view taken along a line VIIB—VIIB.
Figure 7B:
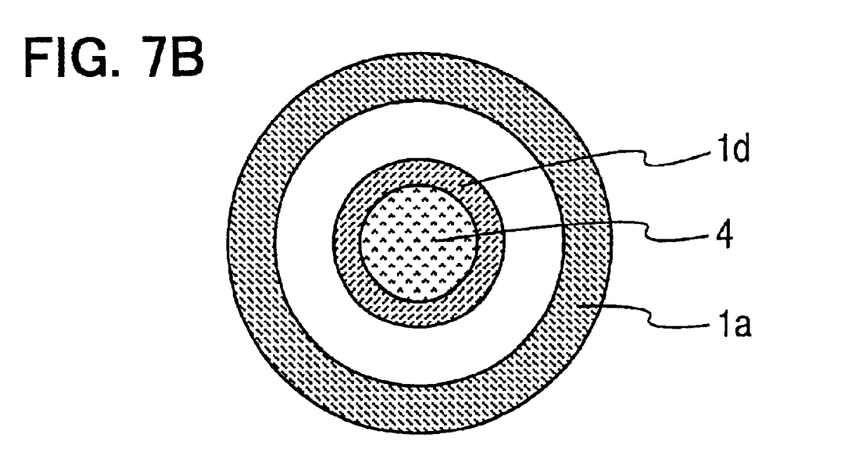

Hereafter, the production of the SiC single crystal in the embodiment will be described with reference to FIGS. 7A and 7B. However, the apparatus configuration and the processes for producing the SiC single crystal are the same as the first embodiment. Thus, only different points will be described.

In the embodiment, the protection layer 5 is made of a carbon layer. Not using the lid member 1c for closing the opening of the seed crystal supporting member 1b, the temperature of the back surface of the SiC seed crystal 3 having the carbon layer is monitored by a radiation thermometer 12. The crystal growth was conducted while a temperature control unit 13 feeds back and controls the temperature of the back surface of the growing SiC seed crystal 3. If the protection layer 5 is formed of the carbon layer, the radiation thermometer 12 can monitor carbon stably. Thus, the radiation thermometer 12 can directly monitor the temperature. Other substances change their thermal emissivity all the time at such a high temperature, so that stable monitoring is impossible. By feeding back and controlling the temperatures of the back surface of the growing SiC seed crystal 3, the growth rate of the crystal is preferably controlled, and a high-quality SiC single crystal is provided with suppressing the generation of macroscopic defects.

(Eighth Embodiment)

Hereafter, the production of the SiC single crystal in a eighth embodiment will be described with reference to FIGS. 8A and 8B. However, the apparatus configuration and the processes for producing the SiC single crystal are the same as the first embodiment. Thus, only different points will be described.

Figure 8A:
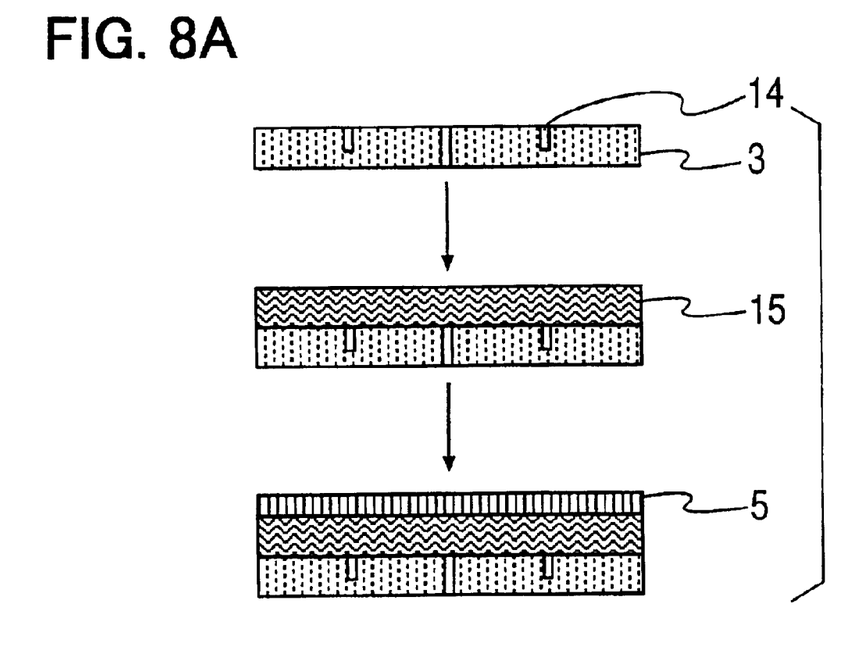
FIG. 8A is a schematic diagram showing a method for blocking microapertures in the seed crystal in an eighth embodiment of the present invention and FIG. 8B is a vertical cross-sectional view showing a configuration of a crystal growing apparatus.
Figure 8B:
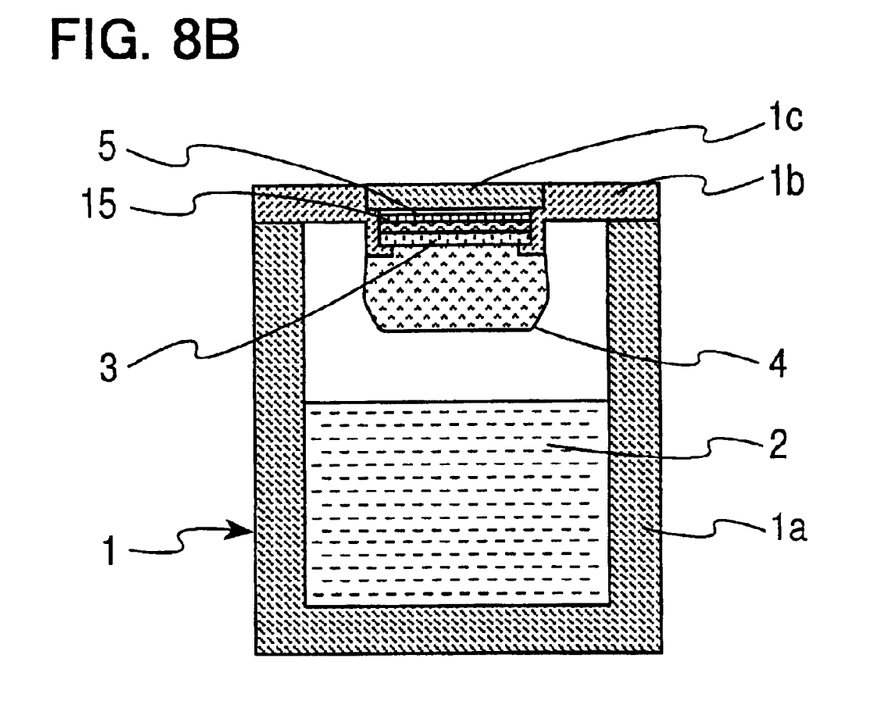

In the eighth embodiment, as shown in FIG. 8A, the SiC seed crystal 3 has fine apertures 14 on the back surface thereof. The back surface is blocked with a blocking substance 15, and then the protection layer 5 is formed. As the blocking substance 15, a carbon sputtered film is formed on all over the entire back surface and completely blocks the fine apertures 14. Afterward, the protection layer 5 is formed thereon. Thereby, the seed crystal 3 substantially not having the fine apertures 14 on the back surface thereof and protected by the protection layer 5 is provided. As shown in FIG. 8B, the seed crystal 3 is supported by the supporting part id as in the first embodiment, and the SiC single crystal 4 is grown. Thereby, a high-quality SiC single crystal is provided with suppressing the generation of macroscopic defects.

In this embodiment, if it is possible to block the fine apertures 14 when the protection layer 5 is formed, the process for forming the blocking substance 15 may be omitted. As the blocking substance 15, epitaxial film, sputtered film, vacuum deposited film or the like, which are made of, SiC, a carbon layer, carbide with high melting point metal, are applicable in addition to the carbon sputtered film. Moreover, in order to block the fine apertures 14, it is possible to fill out the fine apertures 14 with carbon particles.

(Other Embodiment)

The SiC source material powder 2 used in the above embodiments may be replaced with a gas material mixture of silane gas and propane gas or the like. The width of the gap between the SiC seed crystal 3 and the lid member 1c shown in the above embodiments is not necessarily 70 $\mu$m. The width of a few micrometers or more works as well. Furthermore, in the above embodiments, the SiC single crystal is produced by the sublimation method, but the present invention is also applicable to the liquid phase growth, the solid phase growth and the epitaxial growth of a crystal. In addition, single crystals that can be produced according to the present invention are not limited to a SiC single crystal. The present invention is also applicable to substances having a high vapor pressure (one mTorr or greater) at growth temperature thereof. Furthermore, in addition to single crystal production, the present invention is also applicable to heating treatment of a single crystal substrate.

What is claimed is:

1. An apparatus for producing a silicon carbide single crystal where a silicon carbide single crystal substrate that is a seed crystal is disposed inside a container and a source material for the silicon carbide single crystal is supplied to grow the silicon carbide single crystal on the silicon carbide single crystal substrate, the apparatus characterized in that:

a protection layer is formed on a back surface the silicon carbide single crystal substrate;

a supporting part is provided on an inner wall of the container for disposing the silicon carbide single crystal substrate to a predetermined position in the container, wherein the supporting part supports the silicon carbide single crystal substrate at a periphery of a back surface of the silicon carbide single crystal substrate such that an entire front surface of the silicon carbide single crystal substrate faces the source material to grow the silicon carbide single crystal on a front surface.

2. The apparatus for producing a silicon carbide single crystal as in claim 1, further characterized in that:

an opening is formed in a wall of the container at a position facing the protection layer of the silicon carbide single crystal substrate; and a lid-shaped member is provided so as to close the opening.

3. The apparatus for producing a silicon carbide single crystal as in claim 1, further characterized in that:

the protection layer is one of a carbon layer, a layer of carbide with metal having a high melting point, a silicon carbide epitaxial layer, a silicon carbide polycrystalline layer, a silicon carbide amorphous layer and a multilayer film constituted of the above layers.

4. The apparatus for producing a silicon carbide single crystal as in claim 1, further characterized in that a gap with predetermined width is provided between the protection layer of the silicon carbide single crystal substrate and an inner wall of the container.

5. The apparatus for producing a silicon carbide single crystal as in claim 1, further characterized in that: the supporting part supports the substrate by being adhered to the substrate with an adhesive.

6. An apparatus for producing a silicon carbide single crystal where a silicon carbide single crystal substrate that is a seed crystal is disposed inside a container and a source material for the silicon carbide single crystal is supplied to grow the silicon carbide single crystal on the silicon carbide single crystal substrate, the apparatus characterized in that:

the silicon carbide single crystal substrate having a protection layer on a back surface is disposed so as to close an opening formed in a wall of the container;

the silicon carbide single crystal substrate is supported by a supporting part disposed on a side wall defining the opening such that an entire front surface of the silicon carbide single crystal substrate faces the source material to grow the silicon carbide single crystal; and the protection layer is exposed to an outside space.

7. The apparatus for producing a silicon carbide single crystal as in claim 6, further characterized in that: the protection layer is a carbon layer that enables a temperature of the silicon carbide single crystal substrate to be monitored from the outside space.

8. An apparatus for producing a silicon carbide single crystal where a silicon carbide single crystal substrate that is a seed crystal is disposed inside a container and a source material for the silicon carbide single crystal is supplied to grow the silicon carbide single crystal on the silicon carbide single crystal substrate, the apparatus characterized in that:

a protection layer is formed on a back surface the silicon carbide single crystal substrate;

a supporting part is provided on an inner wall of the container for disposing the silicon carbide single crystal substrate to a predetermined position in the container, wherein the supporting part mechanically supports the silicon carbide single crystal substrate at a periphery of the substrate such that a gap with a predetermined width is provided between the protection layer of the silicon carbide single crystal substrate and an inner wall of the container;

an opening is formed in a wall of the container at a position facing the protection layer of the silicon carbide single crystal substrate; and a lid-shaped member is provided so as to close the opening and to adjust the predetermined width of the gap.

9. A substrate for growing a silicon carbide single crystal, comprising:

a silicon carbide single crystal substrate, which is a seed crystal; and a protection layer formed on a back surface of the silicon carbide single crystal substrate, wherein a front surface of the silicon carbide single crystal substrate has a supported face supported by a supporting part and disposed at a periphery of the front surface; and a growth face disposed on a center of the front surface and projecting toward a source material, the growth face for growing the silicon carbide single crystal, wherein the growth face has a conically shaped inner surface that protrudes from the supported face.

* * * * *